United States Patent [19]

Mauntel et al.

[11] Patent Number: 4,808,555

[45] Date of Patent: Feb. 28, 1989

[54] MULTIPLE STEP FORMATION OF CONDUCTIVE MATERIAL LAYERS

[75] Inventors: Richard W. Mauntel; Stephen J. Cosentino; Louis C. Parrillo, all of Austin, Tex.; Patrick J. Holly, Mesa, Ariz.

[73] Assignee: Motorola, Inc., Schaumburg, Ill.

[21] Appl. No.: 884,113

[22] Filed: Jul. 10, 1986

[51] Int. Cl.[4] .......................................... H01L 21/283
[52] U.S. Cl. ..................... 437/191; 437/193; 437/26; 357/71
[58] Field of Search ............... 29/571, 577 C, 589; 148/187; 437/191, 189, 192, 193, 194, 26, 200; 357/71

[56] References Cited

U.S. PATENT DOCUMENTS

| 4,142,926 | 3/1979 | Morgan | 148/187 |
|---|---|---|---|
| 4,143,178 | 3/1979 | Harada et al. | 148/187 |
| 4,151,021 | 3/1979 | McElroy | 148/187 |
| 4,191,603 | 3/1980 | Garbarino et al. | 148/187 |
| 4,322,736 | 3/1982 | Sasaki et al. | 357/68 |
| 4,329,706 | 5/1982 | Crowder et al. | 357/71 |
| 4,373,250 | 2/1983 | Malwah | 29/577 C |
| 4,403,394 | 8/1983 | Shepard et al. | 29/571 |
| 4,443,930 | 4/1984 | Hwang et al. | 357/67 |
| 4,488,931 | 12/1984 | Pansana | 29/571 |
| 4,529,619 | 7/1985 | Nemanich | 427/93 |
| 4,556,897 | 12/1985 | Yorikane et al. | 357/67 |
| 4,581,815 | 4/1986 | Cheung et al. | 29/577 C |
| 4,619,729 | 2/1984 | Johncock et al. | 156/606 |

FOREIGN PATENT DOCUMENTS

| 0048939 | 3/1983 | Japan | 437/191 |
|---|---|---|---|
| 0010718 | 1/1985 | Japan | 437/191 |

OTHER PUBLICATIONS

Ghandhi, *VLSI Fabrication Principles*, John Wiley & Sons, N.Y., 1981, pp. 432–439.
Ghandhi, Sorab, "VLSI Fabrication Principles", John Wiley & Sons, New York, pp. 458–461.
Japanese Kokai Patent No. 60-10718, English translation.

*Primary Examiner*—Brian E. Hearn
*Assistant Examiner*—Beverly A. Pawlikowski
*Attorney, Agent, or Firm*—John A. Fisher

[57] ABSTRACT

A process of forming a conductive material layer in at least two steps by forming a conductive material layer from a plurality of thin layers of conductive material. The use of a two-step formation process for the conductive material layer permits process versatility in incorporating implantation steps and patterning steps between formation of the thin layers of conductive material. Direct transfer from dielectric layer formation to conductive material layer formation steps, and performing the intermediate process steps in the same piece of equipment as the thin conductive layer formation assists in adhesion of the thin layers to each other to form the total conductive material layer. The use of in situ doped semiconductor material, such as in situ doped polycrystalline silicon and in situ doped amorphous silicon reduces the exposure of other dopants that may be present to thermal cycles of high temperature, greater than 900° C., that causes these dopants to migrate undesirably.

7 Claims, 1 Drawing Sheet

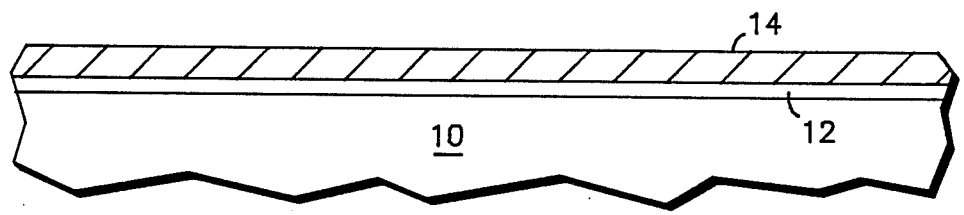
*FIG. 1*
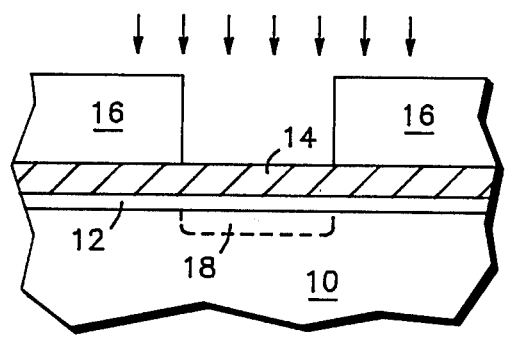
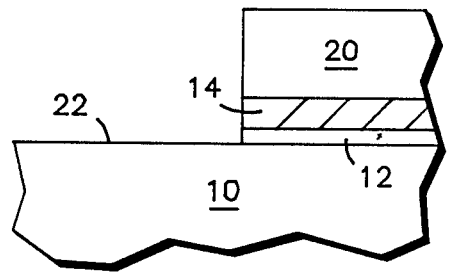
*FIG. 2A*   *FIG. 2B*
*FIG. 3*
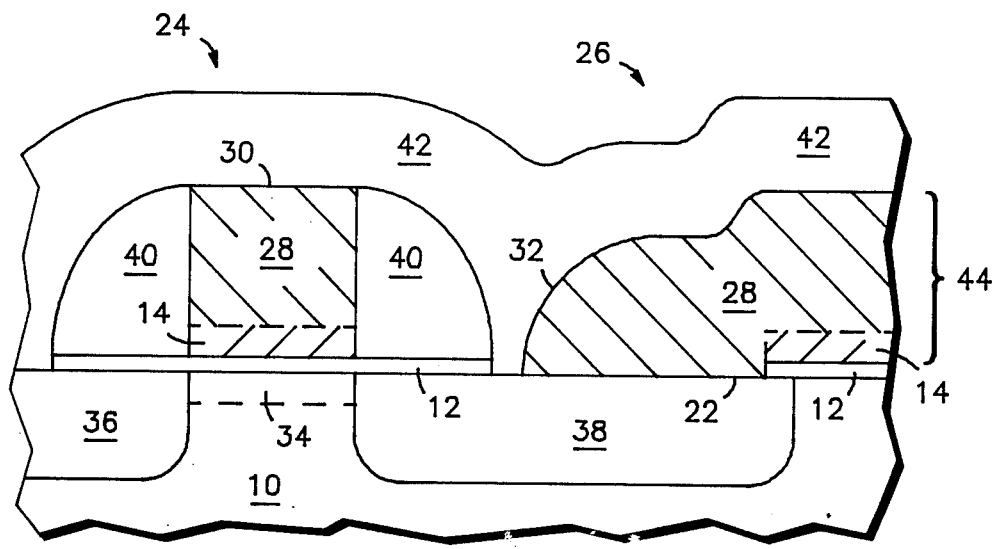

MULTIPLE STEP FORMATION OF CONDUCTIVE MATERIAL LAYERS

FIELD OF THE INVENTION

The invention is related to forming conductive material layers, and is particularly related to techniques for providing a conductive material layer made at low temperature during the manufacture of an integrated circuit, and which may involve intermediate process steps.

BACKGROUND OF THE INVENTION

As integrated circuit process technologies are pushed to produce parts having greater device densities, the dimensions of particular devices such as a field effect transistor (FET) are forced to shrink. As the channel lengths of the FETs are reduced to increase device density, consideration must also be given to the channel depth, that is, the depth of impurity doping in the channel region. If the channel is too deep with respect to the source/drain regions, problems will result with undesirable high capacitance to the source and drain. Other problems include the channel-p-n-junction depth in "buriedchannel" type devices which are widely used in CMOS technology. The deeper the channel-p-n-junction depth is, the more prone the device is to undesirable leakage currents. These problems are particularly acute for p-channel devices. As is well known in the art, impurities which are placed within the structure of an integrated circuit device under construction will be significantly redistributed by subsequent high temperature (greater than 900° C.) thermal cycles. Thus, impurities located in a channel at one step in the process may be driven deeper during subsequent thermal cycles. When devices were larger, some redistribution could be tolerated and the devices would still perform properly. However, as wafer fabrication processes have become more complex and more thermal cycles have been added, with the advent of extremely small devices, it becomes more difficult to have the channel depth placed in its proper position at the end of the processing steps.

A similar problem occurs in the fabrication of capacitors. Pressures to shrink capacitor plates cause designers to increase capacitance by increasing the doping levels at the substrate surfaces. However, subsequent thermal cycles redistribute the impurities deeper and weaken the effects of the extra doping. In addition, as device structures become more exotic, more reliance is placed on exact positioning of the impurity regions. Thus, it would be advantageous if the number of thermal cycles could be reduced in the processing of an integrated circuit.

Another constant concern is the elimination of fabrication steps which may complicate the process and introduce errors. One known method of reducing the number of fabrication steps is to use in situ doped polycrystalline silicon or amorphous silicon, both of which are loosely termed "polysilicon", in contrast to doping the polysilicon after it is formed. Doping amorphous silicon in situ, as it is formed, only requires reaction temperatures on the order of about 575° C. and polycrystalline silicon may be deposited at 625° C., in contrast to the case where the polysilicon is first formed and then doped, where the impurity must be distributed throughout the polysilicon at a high temperature on the order of 900° C. or more. While both of these temperatures may seem high, it is known that dopant positions are maintained for long periods at 575° to 700° C. whereas they will move quickly for even short periods at 900° C. and above. The applicants have discovered a way of using in situ doped amorphous and polycrystalline silicon that not only takes advantage of the reduction in fabrication steps, which is well known, but also of the milder temperature conditions permitted.

Another problem with current wafer fabrication concerns gate dielectric integrity. Silicon dioxide is often used as the thin gate dielectric for transistors or as the interplate dielectric for capacitors. If this thin dielectric layer is exposed outside of a protected processing chamber, it runs the risk of contamination which may eventually cause the layer to break down during use causing a short or other device failure mechanism. Thus, it would be desirable if the process flow allowed "direct transfer" as often as possible, that is, which permitted the wafer to immediately have the next layer formed after the gate oxide layer is formed without any cleaning or other process to avoid this undesirable contamination. Direct transfer results in more reliable gate oxide layers and fewer gate oxide breakdowns.

SUMMARY OF THE INVENTION

Accordingly, it is an object of the present invention to provide a technique for forming a doped semiconductor material layer which will reduce the number of thermal cycles, but not extraordinarily interrupt the customary process flow.

Another object of the invention is to provide a process for forming a doped semiconductor material layer to which a wafer may be directly transferred after the gate dielectric layer is formed.

It is another object of the present invention to provide a method for making a doped semiconductor material layer that can be easily integrated into a process for forming buried contacts.

In carrying out these and other objects of the invention, there is provided, in one form, in an integrated circuit, a conductive material layer created by forming a plurality of thin layers of conductive material. The thin conductive material layers may be formed over a substrate or another layer. Optionally, an intermediate process step may be performed between the forming of the first thin conductive material layers.

BRIEF DESCRIPTION OF THE DRAWINGS

FIG. 1 is a cross section of a semiconductor substrate after the first step of the low temperature, two-step in situ doped semiconductor material process of the present invention;

FIG. 2 is a cross section of a semiconductor substrate after or during the intermediate process step of the method of this invention; and FIG. 3 is a cross section of a portion of an integrated circuit transistor made using the low temperature, two-step in situ doped semiconductor material process of the invention and certain advantages that may be produced.

DETAILED DESCRIPTION OF THE INVENTION

Shown in FIG. 1 is a cross section illustration of a semiconductor substrate 10 having a thin layer of dielectric material 12 formed thereon by growth or deposition covered by a first layer of conductive material 14. Although the invention is not limited hereby, substrate 10 may be a monocrystalline silicon substrate, dielectric material layer 12 may be silicon dioxide and first layer of conductive material layer 14 may be in situ doped amorphous or polycrystalline silicon. The conductor layer 14, if it is amorphous or polycrystalline semiconductor material, may be doped with n-type or p-type or other impurities to enable it to be conductive. The conductor layer 14, and subsequently discussed conductive layer 28 may also be refractory metals and polycides, i.e. combinations of polycrystalline or amorphous silicon and a refractory metal silicides, among other materials. These metals may be formed at temperatures much lower than even the 575° C. or 625° C. used for amorphous and polycrystalline silicon, respectively. Conductor layers 14 and 28 do not need to be the same type of conductive material as long as good electrical contact may be established between them. The conductive material must be capable of being grown, deposited or otherwised formed at a temperature below 900° C., preferably 700° C.

In conventional processes, such as 1.5 or 2.0 micron (um) processes, a sacrificial layer of dielectric material or oxide is formed on the substrate before the channel implant. This sacrificial oxide serves the purposes of cleaning the surface of defects after forming the isolation regions, which are not discussed here, and of serving as a screen mask through which the channel impurities are implanted. The screen oxide is removed along with the defects, and a thin layer of high quality gate oxide, which will be the eventual transistor gate dielectric is grown, deposited or otherwise formed.

However, in the procedure of the invention, which is directed toward finer geometries below about 1.5 um, although a sacrificial oxide is used to clean the surface of the substrate 10, the implant is not performed through it, rather it is removed and the final gate oxide layer 12 is formed next over which is formed the first layer of conductive material 14, which may be in situ doped polycrystalline or amorphous silicon 14. At this point the substrate 10 may be directly transferred to the equipment to provide the first conductive material layer 14 with no intermediate steps such as cleaning.

The first layer of conductive material 14 if amorphous or polycrystalline silicon is deposited using well known in situ doping procedures. These techniques may be performed at what is considered low temperature, namely at any temperature below 900° C.; amorphous silicon may be formed at about 575° C. and polycrystalline silicon may be formed at about 625° C. In situ doping permits the dopant impurities to be placed into the semiconductor material, such as polycrystalline or amorphous silicon, at the time it is being formed permitting a uniform concentration. This is in contrast to forming the semiconductor material layer and then doping the layer by some other means such as diffusion or implantation which requires a later thermal drive-in step usually at or above 900° C. Since in the customary procedure the channel implant would be in place at this time, the channel dopants would migrate under the high temperature conditions and the subsequently completed devices would not perform as designed.

The thickness of the first layer of conductive material 14, such as in situ doped semiconductor material, depends on the nature of the intermediate process step to be conducted between forming the first and second layers of in situ doped semiconductor material. If the channel implantation is to be performed next, as illustrated in FIG. 2A, the first layer of conductive material 14 should be thin, in fact as thin as possible. Using current techniques, and assuming the material 14 to be polycrystalline silicon, about 500 angstroms is about as thin as can be repeatably produced using current technology without pinhole problems. In this context, the term "about 500 angstroms" means 500 angstroms thick, −10%, or from 450 to 550 angstroms. It is not inconceivable that a process may be devised to repeatably and reliably form polycrystalline or amorphous silicon layers thinner than 500 angstroms, which would fall within the scope of this invention. The thin dielectric layer 12 may be about half this thickness or 250 angstroms, although the thickness of the dielectric layer 12 is dependent on the desired device characteristics and not on the inventive process. On the other hand, if the intermediate process step is to be an etch process, as would be required in the formation of a buried contact, the first layer of in situ doped semiconductor material may be thicker, although it is certainly permissible for it to be as thin as possible.

It is at this point that an intermediate process step is performed. The first thin layer of conductive material 14, which may be in situ doped semiconductor material 14, serves to protect the gate dielectric layer 12 during any handling or other steps that may be required such as a masking step. The intermediate process step excludes the formation of a separate new layer, except for the formation of a temporary masking layer, such as a layer of photoresist. For example, the invention does not anticipate the formation of a dielectric layer as the intermediate process step in which case the invention would be reminiscent of multilayer interconnection schemes. The process of the present invention is not otherwise limited by the nature of the intermediate process step which may be any process step that may benefit from splitting the formation of the conductive material layer into two steps as defined by the present process. For example, an unmasked, blanket implant of the channel could be performed into the surface of the semiconductor substrate 10, assuming the first layer of conductive material 14 is thin enough. Or, as shown in FIG. 2A, the channel implant, as represented by the arrows, could be masked by a patterned photoresist layer 16 so that the implant impurities are placed only in selected regions 18 of semiconductor substrate 10. Unlike current procedures, the first conductive material layer 14 and the gate oxide layer 12, both of which served as screens for the channel implant step, are not removed but are retained.

Another important intermediate process step could be the patterning of areas where a buried contact is to be formed as shown in FIG. 2B where patterned photoresist layer 20 allows the etching of conductive material layer 14 and oxide layer 12, so that a buried contact may be formed where the semiconductor substrate is exposed at 22. Although a patterned channel implant as shown in FIG. 2A and patterning for a buried contact as shown in FIG. 2B may certainly occur on the same substrate 10, they must occur at different times and hence the two procedures are shown and described separately. While, as noted above, the first layer of conductive material 14 need not be thin if buried contact patterning only was performed, if both buried contacts and channel implants are to be performed using this layer, first layer 14 is preferably thin. Note also that any patterning that is done, such as to define the buried contact regions or the gate is done on the first conductive material layer 14, which may be in situ doped polycrystalline silicon or amorphous silicon, and not on the gate oxide layer 12, thus preserving the gate oxide integrity.

Shown in FIG. 3 is a completed FET 24 and buried contact 26 thereto in an essentially finished integrated circuit, partially shown. Thin layer of dielectric material 12, first layer of conductive material 14 and second layer of conductive material 28, which may also be an in situ doped semiconductor material such as polycrystalline silicon or amorphous silicon, or a metal layer, are shown in an example of approximately correct proportion, although the proportions of other features may be exaggerated for clarity. After the intermediate process steps shown in FIGS. 2A and 2B, a second thick layer of conductive material 28 is formed on top of the existing first thin layer of conductive material 14. There should be good electrical contact between second thick layer of conductive material 28 and first thin layer of conductive material layer 14, and the layers may be of the same material, such as polysilicon, and have the same dopant, as will be assumed in this description, though it is not required by the invention.

Second layer of conductive material layer 28, which may be in situ doped semiconductor material, may be formed or deposited by the same well-known processes described above in the case of first thin layer of conductive material 14, although as the name implies, layer 28 is appreciably thicker. Second thick layer 28 may be on the order of about 500 to 4000 angstroms thick or thicker. Its thickness depends on a number of parameters to be set by the process designer, such as sheet resistance, etc. In many cases it may be desired to have second layer of conductive material 28 be appreciably thicker than layer 14. For example, second thick layer 28 could be approximately 3000 angstroms thick, or alternatively, four to ten times as thick as the first layer 14, if needed.

Now that second layer of conductive material 28 is provided to complete the entire layer of in situ doped semiconductor material layer 44, layer 44 must be patterned and etched to form the desired features, such as, for example gate electrode 30 and buried contact electrode 32. Gate electrode 30 is positioned on gate oxide layer 12 over the channel 34 formed by the impurity implanted into selected channel region 18 of FIG. 2A. Channel 34 is situated between two source/drain regions 36 or 38 on either side, which are formed from diffusions or implantations in the usual ways. The buried contact electrode 32 makes contact to selected buried contact region 22 of substrate 10. Also shown are sidewall spacers 40, an optional feature, and passivation layer 42.

The process of the invention may be also be accomplished with a plurality of relatively thin layers of conductive material 14 that in combination form an entire, overall conductive material layer. Each thin layer 14 of conductive material may optionally have an intermediate process step conducted after it is formed and before the formation of the next thin layer 14 of conductive material. The inventors submit that the invention concerns the unobvious advantages involved in splitting up a conductive layer into two or more thinner or intermediate conductive layers. This method provides process versatility by enabling the process designer to introduce the intermediate process steps. Adhesion problems between the various thin layers 14 of conductive material are not an issue since the wafers may be directly transferred from one process to another without subsequent cleaning steps, or other processing steps, or may have the intermediate process step conducted in the same piece of equipment that the thin layers 14 of conductive material are formed.

Thus, a process has been described which allows devices with features below about 1.5 um to be made with buried contacts, and greater gate dielectric integrity due to direct transfer after the dielectric is formed and protection of the dielectric with the first thin in situ doped semiconductor material layer. In addition, by splitting up the formation of in situ doped semiconductor material layer into first and second layers, greater versatility is afforded the processing with respect to intermediate process steps, thus allowing the above advantages while also limiting the thermal exposure of the channel implants, and other implants such as for capacitor formation, even though the process is made slightly more complex by the two step formation. For example whereas in conventional processing the implant would be subjected to a minimum of one hour at 900° C. which would cause excessive dopant migration, with the present inventive process, the implant is only exposed to 575° C. or 625° C. or lower for only a slightly longer time, which does not cause appreciable dopant migration. If a refractory metal or silicon/metal combination (e.g. polycide) material is used, the temperature would be much lower than these.

We claim:

1. A process providing an integrated circuit having a two-stage conductive material layer, comprising the steps of:

providing a semiconductor substrate;

forming a gate dielectric layer over the semiconductor substrate;

forming at a temperature below 900° C. a first thin layer of conductive material over the gate dielectric layer;

performing an intermediate process step upon the first thin layer of conductive material; and forming at a temperature below 900° C. a second thick layer of conductive material over the first thin layer of conductive material, wherein the conductive material of the second layer is the same as the first layer, in the absence of a required reactive step between the first layer and the second layer to form the conductive material layer and in the absence of an intervening dielectric layer.

2. The process of claim 1 wherein the intermediate process step excludes the formation of an additional layer except for the formation of a temporary masking layer.

3. A process providing an integrated circuit having a two-stage conductive material layer comprising the steps of:

providing a semiconductor substrate;

forming a gate dielectric layer over the semiconductor substrate;

forming at a temperature below 900° C. a first thin layer of conductive forming at a temperature below 900° C. a first thin layer of conductive material over the gate dielectric layer;

implanting an impurity through the first thin layer of conductive material;

patterning the first thin layer of conductive material and the layer of dielectric material beneath it to expose selected portions of the underlying semiconductor substrate, and forming at a temperature below 900° C. a second thick layer of conductive material over the first thin layer of conductive material, in the absence of a required reactive step between the first layer and the second layer to form the conductive material layer wherein the second thick layer of conductive material also covers the exposed selected portions of the underlying substrate to form a buried contact and wherein the first thin layer of conductive material is between one fourth and one tenth of the thickness of second thick layer of conductive material.

4. A process providing an integrated circuit having a two-stage conductive material layer comprising the steps of:

providing a semiconductor substrate;

forming a gate dielectric layer over the semiconductor substrate;

forming at a temperature below 900° C. a first thin layer of conductive material over the gate dielectric layer;

implanting an impurity through the first thin layer of conductive material;

forming at a temperature below 900° C. a second thick layer of conductive material over the first thin layer of conductive material, in the absence of a required reactive step between the first layer and the second layer to form the conductive material layer and wherein the first thin layer of conductive material is between one fourth and one tenth of the thickness of second thick layer of conductive material.

5. The process of claim 4 wherein the first and second layers of conductive material are selected from the group consisting of refractory metals, refractory metal silicides and in situ doped semiconductor materials.

6. The process of claim 4 wherein the in situ doped semiconductor material layers are selected from the group consisting of in situ doped amorphous silicon and in situ doped polycrystalline silicon and the gate dielectric layer is silicon dioxide.

7. The process of claim 3 wherein the intermediate process step is patterning the layer of conductive material and the layer is dielectric material beneath it to expose selected portions of the underlying semiconductor substrate, and wherein the second layer of conductive material also covers the exposed selected portions of the underlying substrate to form a buried contact.

* * * * *

UNITED STATES PATENT AND TRADEMARK OFFICE
CERTIFICATE OF CORRECTION

PATENT NO. : 4,808,555

DATED : Feb. 28, 1989

INVENTOR(S) : Richard W. Mauntel, Stephen J. Cosentino, Louis C. Parrillo and Patrick J. Holly It is certified that error appears in the above-identified patent and that said Letters Patent is hereby corrected as shown below:

Column 6, line 58, delete "forming at a temperature below 900° C. a first thin"

Column 6, line 59, delete "layer of conductive"

Column 8, line 21, change "is" to --of--

Signed and Sealed this

Eighteenth Day of February, 1992

Attest:

HARRY F. MANBECK, JR.

*Attesting Officer*     *Commissioner of Patents and Trademarks*